(12) United States Patent
Dell et al.

(10) Patent No.: US 6,233,639 B1
(45) Date of Patent: May 15, 2001

(54) MEMORY CARD UTILIZING TWO WIRE BUS

(75) Inventors: Timothy J. Dell, Colchester; Bruce G. Hazelzet; Mark W. Kellogg, both of Essex Junction; Clarence R. Ogilvie, Huntington; Paul C. Stabler, South Burlington, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/225,524

(22) Filed: Jan. 4, 1999

(51) Int. Cl.$^7$ ........................................ G06F 13/00
(52) U.S. Cl. .................. 710/129; 710/128; 710/62; 710/72
(58) Field of Search .................. 710/129, 128, 710/101, 102, 103, 63, 62, 71

(56) References Cited

U.S. PATENT DOCUMENTS

| | | |
|---|---|---|
| 4,885,538 * | 12/1989 | Hoenniger, III et al. ............ 324/312 |
| 5,404,522 | 4/1995 | Carmon et al. . |
| 5,440,740 | 8/1995 | Chen et al. . |
| 5,450,551 | 9/1995 | Amini et al. . |
| 5,519,839 | 5/1996 | Culley et al. . |
| 5,546,547 | 8/1996 | Bowes et al. . |
| 5,557,757 | 9/1996 | Gephardt et al. . |
| 5,600,845 * | 2/1997 | Gilson ................................... 712/39 |
| 5,675,751 | 10/1997 | Baker et al. . |
| 5,692,211 | 11/1997 | Gulick et al. . |
| 5,739,850 * | 4/1998 | Hori ..................................... 348/231 |
| 5,928,347 * | 7/1999 | Jones ................................... 710/129 |

* cited by examiner

Primary Examiner—Ario Etienne
(74) Attorney, Agent, or Firm—William N. Hogg

(57) ABSTRACT

A serial bus and connection to a device on a computer system through a system memory controller is provided on a memory card having a DSP and a memory bus controller to allow the DSP on the memory card to gain access to the system device without using the system memory bus. The serial bus is a two wire serial bus connecting the device to the DSP through the system memory controller. If more than one memory card is present with DSPs or more than one device is contending for access, the system memory controller or arbitrate the access of each memory card or contending device. In such case the serial bus will signal the system memory controller when it wants access to the particular device, and the system memory controller will act as arbitrator to grant or not grant access to the particular memory card or device requesting access. If access is granted the bus memory controller outputs the required control or command word on the serial bus followed by the address and the required data. This serial information is received by the system memory controller which packets it, and, upon completion, outputs the information rapidly on a parallel bus, e.g. a PCI bus to the device which needs the information.

12 Claims, 2 Drawing Sheets

MEMORY CARD UTILIZING TWO WIRE BUS

BACKGROUND INFORMATION

1. Field of the Invention

This invention relates generally to busses for memory cards to allow a Digital Signal Processor (DSP) on a memory DIMM or SIMM to communicate with a system memory controller, and more particularly to the use of a serial bus for communication of a DSP on a memory card with a system memory controller.

2. Background Information

The use of DSPs on memory cards is now being proposed as a way for providing a relatively inexpensive processor on a memory card which can perform tasks on the card while the system bus is otherwise occupied. This works well in so far as it goes; i.e. as long as the DSP needs to be used only on the card on which it resides and does not need to communicate with the system bus this arrangement is fine. However with the present proposals there is no mechanism for the DSP on the card to initiate communication with the system bus and ultimately with devices controlled by the system bus. Since the DSP is a relative powerful processor it is desired that a technique be provided for a DSP to initiate communication effectively and simply with the system bus.

SUMMARY OF THE INVENTION

According to the present invention a serial bus and connection to a device on a computer system, preferably through a controller such as a system memory controller is provided on a memory card having a DSP and a memory bus controller to allow the DSP on the memory card to gain access to the device on the system bus without the need to use the system memory bus. The serial bus in its preferred form is a two wire serial bus which connects the device to the DSP through a memory bus controller and preferably through the system memory controller. If more than one memory card is present with DSPs or more than one device contending for access, the system memory controller or other controller will arbitrate the access of each memory card or contending device. In such case the serial bus will signal the system memory controller when it wants access to the particular device, and the system memory controller will act as arbitrator to grant or not grant access to the particular memory card or device requesting access. If access is granted the bus memory controller outputs the required control or command word on the serial bus followed by the address and the required data. This serial information is received by the system memory controller or some other controller which packets it, and, when the transmission is complete, outputs the information rapidly on a parallel bus, e.g. a PCI bus to the device which needs the information. Thus each DSP in effect becomes a bus master when so required for transferring data to and from a device other than the specific memory card on which it resides. The DSP can also take control for reading data from a device using the serial bus.

DESCRIPTION OF THE PREFERRED EMBODIMENT(S)

Figure 1:
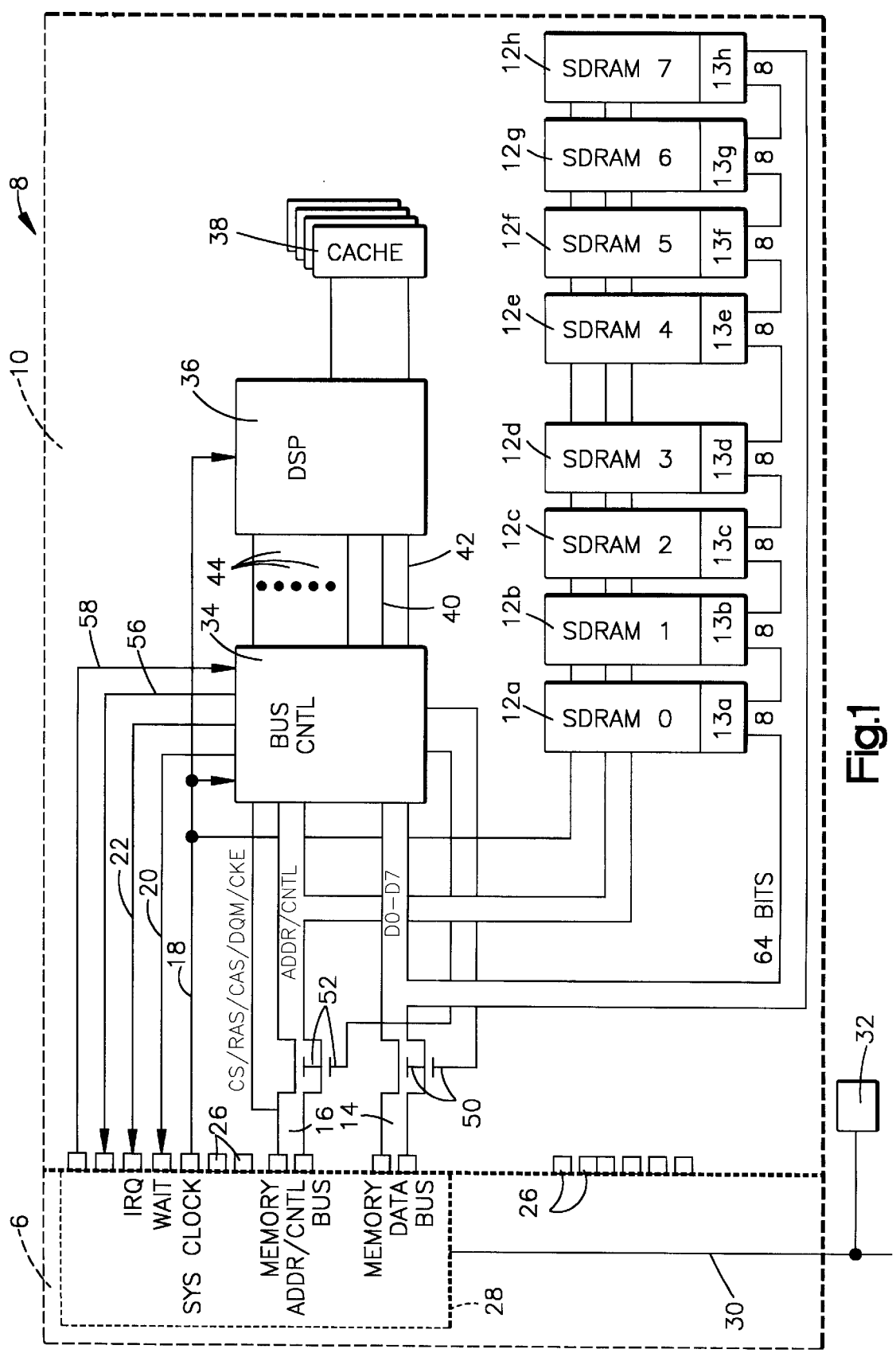
FIG. 1 is diagram of a DIMM incorporating a DSP and memory bus controller and having a two wire serial bus communicating with a system memory controller.

Referring now to the drawings and for the present to FIG. 1, one embodiment of the present invention is shown as embodied in a personal computer G. A memory module 8 such as a DIMM or SIMM is provided which includes a printed circuit card 10 having a plurality of synchronous DRAMs (SDRAMs) 12a through 12h. (It is to be understood that the number of the SDRAMs could be more or less, and that they can be arranged in one or more banks, as is well known in the art.) The synchronous DRAMs 12a–12h, which are conventional SDRAMs, are configured and arranged to store both data bits and check bits written to them by the computer system. The SDRAM's 12a–12h each have memory location 13a–13h reserved for a signal processing element which will be described presently. The circuit card 10 has a memory bus which includes a memory data bus 14 and a memory address/control bus 16; a system clock line 18, a wait line 20 and an interrupt request line 22 are also present. Memory data bus 14, memory address/control bus 16, system clock 18, wait line 20 and interrupt request line 22 are all connected to I/O connectors sometimes referred to as pins 26. The I/O connectors 26 provide an interface to a system memory controller 28, which is a part of the CPU or computer 6. The system memory controller 28 also controls a PCI bus 30 (and optionally other buses not shown). The PCI bus 30 has thereon devices such as a codec 32.

The memory card 10 also has a memory bus controller 34 which is connected to the memory data bus 14, the memory address/control bus 16, the system clock 18, the wait line 20, and the interrupt request line 22. The bus controller 34 is connected to a signal processing element 36 which in the preferred embodiment is a digital signal processor (DSP). A particularly useful DSP is any one of the TMS 320C54X family manufactured by Texas Instruments, Inc. This particular DSP family includes an external cache memory 38. The bus controller 34 and DSP 36 are interconnected by a chip address bus 40, a chip data bus 42 and control lines 44 that pass various control signals between the bus controller 34 and the DSP 36. This type of connection is well known in the art.

The memory data bus 14 has FET switches 50 therein. (It is to be understood that the memory data bus 14 is comprised of multiple lines, one for each bit and there is an FET 50 for each bit line.) The memory data bus 14 may be an 8 bit bus, a 16 bit bus, a 32 bit bus, or a 64 bit bus, and indeed any size data bus which includes whatever number of data lines are required. Also there are FET switches 52 in the system address/control bus 16. The system clock line 18 is also connected to the DSP 36 in the preferred embodiment; however, it is to be understood that a separate clock could be provided for the DSP if different timing is used on the card from the timing used in the CPU. However, the preferred embodiment for most instances is to use the system clock for clocking the functions and signals on the memory module.

A two wire serial bus, comprised of wires 56, 58 is provided connecting the bus controller 34 to two contacts 26, which contacts 26 communicate the system memory controller 28.

Many tasks of the DSP are accomplished when the memory module is not being addressed for either a read or write function or other function by the CPU memory controller 28. Thus the FETs 50 and 52 are in an open position when these tasks are taking place. If however, when the CPU wishes to access the memory module the FET's are closed and the memory controller 28 can address the memory module 8 on the memory data bus 14 and memory address/control bus 16 to perform conventional read/write operations from and to the SDRAMs 12a–12h.

Figure 2:
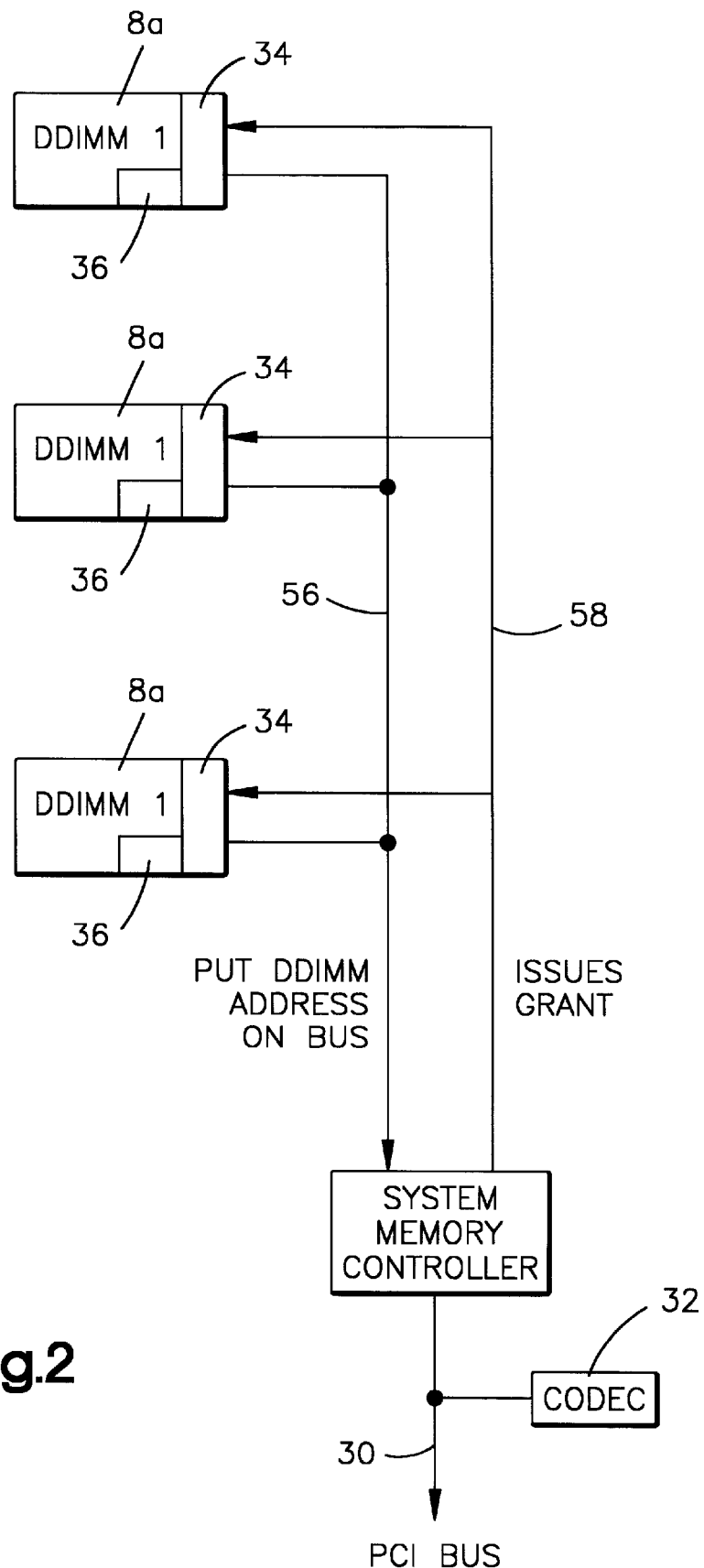
FIG. 2 is a block diagram of the connection of several memory modules to a system memory controller.

Referring now to FIG. 2 a block diagram of the system of several memory modules 8a, 8b, and 8c each having a DSP and two wire serial bus is shown. In this embodiment it is assumed that the different modules 8a, 8b and 8c will be contending for access to the device(s) on the PCI bus. The serial bus wires 56, 58 are used for bus arbitration and the serial transfer of commands and data between the system memory controller 28 and the various modules 8a, 8b, 8c. When a particular memory module 8a, 8b or 8c needs to supply data to one of the devices on a bus, e.g. the codec 32 on the PCI bus 28, the memory controller 34 for that module 8a, 8b or 8c places its address on the control word line 56 of the serial bus. The system memory controller 28 performs bus arbitration and either issues a grant on wire 58 or ignores the request. If the grant is issued, and it is for a write to the codec 32, the memory bus controller 34 on the requesting memory module 8a, 8b or 8c is programmed to format the required information and issues the command or control word on the wire 56, followed by the address and required data in a form that can be received by the system memory controller 28. These are all issued serially on the bus wire 56. The serial data is received and packeted by the system memory controller 28, which, when completed, issues the commands, addresses and data on the bus on which the requesting device is located, e.g. on the PCI bus 30 for the codec 32.

If the request from the memory module 8a, 8b or 8c is for a read, the requesting memory module remains in control of the serial bus and the request is relayed to the codec 32 which transfers the requested data and information to the system memory controller 28 which formats the data in a format suitable for transmission on the serial bus wires 56, 58, and then transfers the information to the requesting memory module. When the transfer is completed, the requesting memory module relinquishes the serial bus. If, however, the codec 32 initiates the request, the PCI bus 30 will arbitrate when the codec 32 gets the bus, at which time the codec transfers the information on the PCI bus to the system memory controller 28 which then transfers the information to the designated memory module 8a, 8b or 8c on the system memory bus rather than on the serial bus.

It should be noted that while the system memory controller 28 is receiving and packeting the serial data from the memory module on serial bus wire 56, it is free to perform other tasks, including but not limited to, passing information on the memory address/control bus 16 and the memory data bus 18 with any one of the memory modules 8 including the module 8a, 8b or 8c transmitting on its serial bus wire 56. Thus the serial bus can act independently of the system bus and allow the DSP 36 on any of the memory modules 8a, 8b or 8c be a bus master; and, this is accomplished without the need or requirement for one of the DSPs 36 to obtain control of the system bus.

In the embodiment shown in FIG. 2 there are several memory modules 8a, 8b, and 8c which contend for access, so in this case a controller is needed such as the memory controller 28. If, however there is only one memory module 8, and only slave device(s) on the bus where contention is not required, the serial bus wires 56 and 58 could be wired directly to the device(s) and the information transferred serially if each device is configured to receive serial information.

It should be noted that in the preferred embodiment the serial bus communicates with the system memory controller 28, which in turn communicates with a PCI bus 30 on which the codec 32 is located. However, other schemes could be employed. For example other busses than a PCI bus could be employed, or a controller other than the system memory controller 28 could be used to communicate with the memory modules 8 and control the bus on which a device is located. And, of course, other devices could be used.

Accordingly, the preferred embodiments of the present invention have been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A memory module, comprising;

a memory card, a signal processing element on said card, a bus controller on said card, memory storage chips on said card connected to said bus controller, a memory bus connecting said signal processing element and said bus controller, a parallel system bus connected to said memory controller, and a serial bus distinct from said system bus connected to said processing element through said bus controller and to contacts on said card.

2. The invention as defined in claim 1 wherein said signal processing element is a digital signal processor.

3. The invention as defined in claim 1 wherein said serial bus is two wire bus.

4. The invention as defined in claim 1 further characterized by switches to selectively connect and disconnect the system bus and the bus controller.

5. A computer system including a parallel system bus and at least one memory module incorporated in the computer system comprising;

said at least one memory module including a memory card, a signal processing element on said card, a bus controller on said card, memory storage chips on said card connected to said bus controller, a memory bus connecting said signal processing element and said bus controller, said parallel system bus connected to said bus controller, a serial bus distinct from said system bus connected to said processing element through said bus controller and to contacts on said card, and at least one device operatively connected to said serial bus through said contacts on said card.

6. The invention as defined in claim 5 wherein each said device is on a bus in said system.

7. The invention as defined in claim 6 wherein said serial bus connects to said device through a controller.

8. The invention as defined in claim 6 wherein said bus within said system is connected to a system bus through a system memory controller.

9. The invention as defined in claim 7 wherein said serial bus connects to said device through said system memory controller.

10. The invention as defined in claim 8 wherein there are a plurality of said memory modules incorporated in said computer system.

11. The invention as defined in claim 8 wherein said controller arbitrates access to said at least one device.

12. The invention as defined in claim 6 wherein said at least one device is a codec.

* * * * *